United States Patent [19]

Tsu et al.

[11] Patent Number: 5,573,979
[45] Date of Patent: Nov. 12, 1996

[54] SLOPED STORAGE NODE FOR A 3-D DRAM CELL STRUCTURE

[75] Inventors: Robert Y. Tsu, Plano; Wei-Yung Hsu, Dallas, both of Tex.

[73] Assignee: Texas Instruments Incorporated, Dallas, Tex.

[21] Appl. No.: 387,509

[22] Filed: Feb. 13, 1995

[51] Int. Cl.⁶ ................................................. H01L 21/44
[52] U.S. Cl. ........................... 437/195; 437/190; 437/201; 437/193; 437/981
[58] Field of Search ........................ 437/195, 245, 437/246, 193, 190, 201, 981

[56] References Cited

U.S. PATENT DOCUMENTS

| | | |
|---|---|---|
| 4,959,745 | 9/1990 | Suguro . |
| 5,111,355 | 5/1992 | Amand et al. . |
| 5,195,018 | 3/1993 | Kwon et al. . |
| 5,406,447 | 4/1995 | Mujozaki . |

*Primary Examiner*—George Fourson
*Assistant Examiner*—C. Everhart
*Attorney, Agent, or Firm*—Bret J. Petersen; James C. Kesterson; Richard L. Donaldson

[57] ABSTRACT

Generally, the present invention utilizes dry plasma etching techniques such as Electron Cyclotron Resonance (ECR) to produce sloped sidewalls on a DRAM storage cell. The rounded corners of the lower electrode made by this technique allow the advanced dielectric material to be deposited without substantial cracking, and it also allows the capacitance to be closely predicted and controlled due to the uniformity in which the advanced dielectric layer can be fabricated. One embodiment of the present invention is method of making a microelectronic structure comprising a supporting layer (e.g. Si substrate 30) having a principal surface, a lower electrode overlying the principal surface of the supporting layer, and a high-dielectric-constant material layer (e.g. BST 44) overlying the top surface of the lower electrode. The lower electrode comprises a barrier layer (e.g. TiN 36), and an unreactive layer (e.g. Pt 42).

19 Claims, 3 Drawing Sheets

SLOPED STORAGE NODE FOR A 3-D DRAM CELL STRUCTURE

CROSS-REFERENCES TO RELATED APPLICATIONS

The following previously filed applications are related to the instant application:

| Title | Inventors | Ser. No. |
|---|---|---|
| High-Dielectric-Constant Material Electrodes Comprising Sidewall Spacers | Nishioka Park Bhattacharya Summerfelt | 08/283,871 |
| Improved Electrical Connections to Dielectric Materials | Gnade, Summerfelt | 08/009,521 |
| Improved Electrical Connections to Dielectric Materials | Gnade, Summerfelt | 08/260,149 |
| Improved Electrode Interface for High-Dielectric-Constant Materials | Summerfelt, Beratan | 08/041,025 |
| Improved High-Dielectric-Constant Material Electrodes Comprising Thin Platinum Layers | Summerfelt, Beratan, Krilin, Gnade | 08/283,881 |

FIELD OF THE INVENTION

This invention generally relates to improving structures and techniques for using materials with high-dielectric-constants in the construction of integrated devices such as capacitors. More particularly, it relates to forming sloped side surfaces on the bottom electrode of a capacitor. The preferred embodiments are directed to dynamic random access memories (DRAMS).

BACKGROUND OF THE INVENTION

Without limiting the scope of the invention, its background is described in connection with current methods of forming electrical connections to high-dielectric-constant materials on semiconductor microcircuits.

DRAMs are used in many digital electronic devices and are most commonly used for computer memory. The ever increasing need for more memory in a computer has driven the demand for high density DRAMs. DRAMs generally use a capacitor as a data storage device, and it is the capacitor in these devices that is becoming the largest user of precious circuit real estate. Achieving higher density capacitor circuits will require higher storage capacitance for a given area on the integrated circuit. Generally, total storage capacitance is related to the surface area of the electrode in contact with the capacitor dielectric, and the dielectric constant of the material between the electrodes. The current method generally utilized to achieve higher capacitance per area on a microcircuit is to increase the capacitor surface area/unit area by increasing the topography, such as in trench and stack capacitors using conventional $SiO_2$ or $SiO_2/Si_3N_4$ as the dielectric. This approach becomes very difficult in terms of manufacturability for devices such as the 256 Mbit and 1 Gbit DRAMs.

An alternative approach is to use a material for the capacitor dielectric that has a higher dielectric constant which will increase the total storage capacitance without a corresponding increase in circuit area. Integrated circuits which include capacitors will require such materials with advanced dielectrics to obtain higher densities. As used herein, the term "advanced dielectric" means a material having a dielectric constant greater than about 50 at device operating temperature. Many materials, such as $(Ba,Sr)TiO_3$ (BST), have advanced dielectric constants which are generally much higher than the dielectric materials used in standard microelectronic devices. Various metals and metallic compounds, and typically noble metals such as Pt and conductive oxides such as $RuO_2$, have been proposed as the electrodes for these advanced dielectric materials. To be useful in electronic devices, however, reliable electrode structures and methods must be devised which do not diminish the beneficial properties of these high-dielectric-constant materials.

SUMMARY OF THE INVENTION

In accordance with the present invention, an improved method is provided for constructing bottom electrodes with a sloped sidewall on high density integrated circuit capacitors. The method further allows advanced dielectric or high-k materials to be deposited on the lower electrode without deleterious affects to the previously deposited underlying materials or layers, while providing a larger contact area and maintaining a smooth upper surface to prevent cracking of the advanced dielectric at the upper corners.

The present invention provides a method of obtaining the sloped sidewall in an economical manner using a dry etch process. Dry etch processes were first developed in the semiconductor industry to obtain advantages over wet etching processes. One advantages of dry etch is that it can be more precisely controlled than wet etching. Another significant advantage of dry etch is anisotropic etch capability. This is where the step of the etch pattern is substantially 90° or the direction of the etch proceeds in primarily the vertical direction or normal to the substrate surface. Most modern etch processes and equipment attempt to achieve total anisotropic etching. This is desirable because more precise integrated circuit structures are possible when undercutting caused by isotropic etching is not a significant factor. In contrast, the present invention anticipates using a high density plasma reactor configured to obtain an etch pattern which also proceeds in a horizontal direction or parallel to the substrate surface. In this way, the process partially resembles an isotropic etch, like the old wet etching processes, but with the advantages of dry plasma etching.

Most integrated circuit etching technology requires material removal in selected regions. This is done by coating the entire surface with a etch resistant photoresist, selectively removing the photoresist to leave the areas that are not to be etched, and then exposing the surface to the etch process. A photoresist is normally chosen and patterned in sufficient thickness such that it will not be substantially eroded prior to etching the desired pattern in the target material. The ratio of the etch rate of the target material compared to the etch rate of the photoresist is the selectivity of the etch. Normally, large selectivities, greater than about 8 or 10, are desirable to prevent undercutting and allow broader process windows. In contrast, the present invention uses lower selectivity etch chemistry or photoresists to obtain a sloped sidewall on a DRAM bottom electrode. The present invention is apparently the first time plasma processing techniques have been optimized to etch sloped sidewalls, rather than substantially perpendicular sidewalls, on capacitor bottom electrodes.

The need for sloped sidewalls on bottom capacitor electrodes is related to the deposition of advanced dielectric materials on the bottom electrode. The deposition of an advanced dielectric material usually occurs at high temperature (generally greater than about 500° C., and typically greater than 600° C.) in an oxygen containing atmosphere. Many electrode materials oxidize and become insulating or otherwise degrade in this type of environment. An initial electrode structure formed prior to the advanced dielectric material deposition should be stable both during and after this deposition, while subsequent electrode structures formed after this deposition need only be stable after this deposition. As used herein, the term "unreactive", when used in reference to a material contacting an advanced dielectric material, means a material which provides a stable conductive interface to the advanced dielectric material during and after processing.

Regardless of the specific materials used as the electrodes for advanced dielectric materials, some problems especially in area of semiconductor process integration are generally common to all. In particular, it has been discovered that crack formation in the advanced dielectric material can occur at the lower and/or upper corners of the lower electrode during (or after) advanced dielectric material deposition or annealing. It appears that this crack formation may be due to the stress concentration in the advanced dielectric material at the relatively sharp lower electrode corner edges. These cracks can reach from the upper surface of the advanced dielectric material layer down to the lower electrode, with detrimental results. For example, if a conductive layer, such as an upper electrode for a capacitor, is deposited on the advanced dielectric layer, the capacitor can have substantial leakage or even be shorted between the two electrodes.

Patent application by Nishioka et. al., Ser. No. 08/283,871, discloses a lower electrode comprising a sidewall spacer to form a top surface with rounded corners, on which the advanced dielectric material can be deposited without substantial cracking. The sidewall spacer was also designed so as not to reduce the electrical contact surface area between the lower electrode and the advanced dielectric material layer.

Generally, the present invention utilizes a method of fabricating a lower electrode without the additional steps of forming a sidewall spacer while having the same benefits as a sidewall spacer. The present invention, like the sidewall spacer, provides rounded corners to prevent cracking of the advanced dielectric layer. The term "aspect ratio", when used in reference to the physical dimensions of a structure, means the ratio of the height to the width of a structure. A higher aspect ratio allows a larger surface area in contact with the advanced dielectric material, to maximize capacitance for a given amount of semiconductor real estate and a given slope. However, there is trade off between electrode surface area and slope. As the slope is decreased to a smaller angle, the electrode surface area experiences a corresponding reduction.

A sloped sidewall structure also provides better thickness and composition uniformities on the top and side of the node. The smooth transition of the non-reactive layer produced by the method of the present invention allows the application of the advanced dielectric material to have a uniform thickness. Since node capacitance is inversely proportional to the advanced dielectric thickness, the capacitance can be more closely predicted and controlled with the method of the present invention to form the sloped sidewall structure.

The present invention allows side slopes of smaller angles than was previously possible by prior art etching processes or by separate sidewall spacers discussed hereinabove. Lower sloped walls, with angles less than about 70 degrees from the horizontal substrate surface, may allow sputtering techniques to be used to apply the BST layer rather than conformal CVD. At higher side angles, a conformal coating, e.g. CVD is generally preferred to get high conformality, or uniform thickness coverage of the BST layer. At lower side angles sputtering would become feasible because sufficient conformality could be obtained on the gentle angle with conventional sputtering processes. Sputtering is preferred to CVD in some applications because it has a larger process window due to the easier process control, there are fewer problems with contamination and it is less complicated and therefore less costly and more reproducible.

An embodiment of the present invention uses an Electron Cyclotron Resonance (ECR) plasma etching reactor with a $Cl_2$/Ar atmosphere (50%, 50%). The temperature of substrate, $T_s$ is preferably controlled with a cooled chuck to between 0 and 50 degrees C. This prevents overheating of the photoresist and controls the etch selectivity between the platinum, $SiO_2$ and the photoresist. The target substrate is biased to between 200 and 300 V from the potential of the plasma stream to increase the plasma velocity. The plasma density for this embodiment is $10^{11}$ ions/cm$^3$. The reactor includes a lower multipolar magnetic confinement structure to confine the plasma. This confinement increases the density of the plasma which in combination with the plasma energy and etch selectivities results in more horizontal etch of the platinum and photoresist, shown in FIG. 3. The selectivity of the Platinum/photoresist is between ½ and ¼ and preferably about ½ to achieve the slope of a preferred embodiment or about 60 degrees. With this process lower angle slopes are possible than with conventional dry or wet etching processes.

An embodiment of the present invention includes forming a supporting layer having a principal surface, then depositing and etching a lower electrode on the principal surface of the supporting layer, and then depositing a high-dielectric-constant material layer on the top surface of the lower electrode. The etching of the lower electrode uses a dense, on the order of $10^{11}$ ions/cm$^3$, dry plasma etching to form sloped lateral sides on the unreactive layer. The etch also gives a gentle rounded transition from the lateral sides to the top surface of the lower electrode. The sloped sides allow for uniform step coverage with the advanced dielectric, and the rounded corner of the top surface minimizes crack formation in the high-dielectric-constant material layer.

These are apparently the first microelectronic structures wherein a sloped electrode is fabricated using dry plasma etching techniques to facilitate deposition of an advanced dielectric material. These microelectronic structures may also be used for multilayer capacitors and other thin-film devices such as pyroelectric devices (e.g. uncooled infrared detectors, and non-volatile ferroelectric RAMs using permanent polarization properties.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

The preferred embodiment of the present invention is best understood by referring to FIGS. 1–9 of the drawings, like numerals are used for like and corresponding parts of the various drawings.

Figure 1:
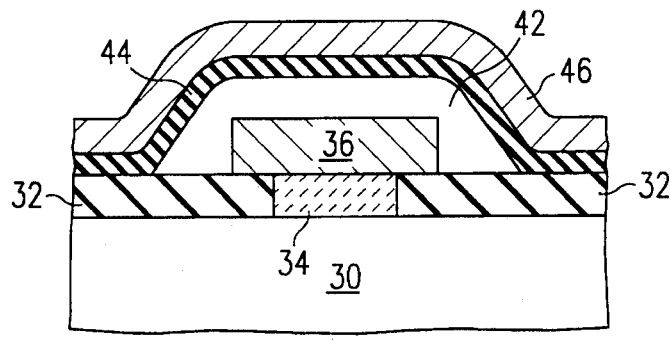
FIG. 1 represents a completed structure using the method of this invention.

With reference to FIG. 1, there is shown a completed structure of an embodiment of the present invention, wherein a lower electrode structure 42 comprising a sloped sidewall with rounded corners on which the advanced dielectric material 44 can be deposited without substantial cracking. The present invention provides a method of obtaining the sloped sidewall in an economical manner using a dry etch process. Dry etch processes were developed to precisely control the etching process and to allow anisotropic etch capability, wherein the step of the etch pattern is substantially 90°. In contrast, the present invention uses a newly developed dry process that may also be used to get horizontal etching. The present invention is apparently the first time this etch process has been optimized and used to form sloped sidewalls, rather than substantially perpendicular sidewalls, on capacitor bottom electrodes. With this process sloped sidewalls can be obtained without the additional steps required in previous processes to form sidewalls using anisotropic techniques. In addition, the angle of the slope can be smaller than that obtained with previous techniques.

Figure 2:
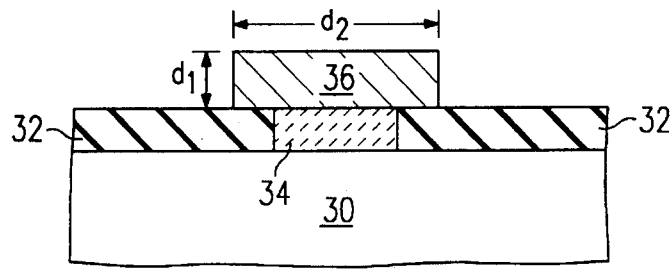
FIGS. 2–8 are cross-sectional views of a microelectronic structure showing the progressive steps in the fabrication of a DRAM storage cell with sloped sides using the present invention.

With reference to FIGS. 2–8, there is shown a method of forming an embodiment of the present invention which is shown in the completed structure of FIG. 1. FIG. 2 illustrates a poly-Si plug 34 formed in $SiO_2$ layer 32, overlying silicon semiconductor substrate 30 A 100 nm TiN layer 36 overlying the $TiSi_2$/poly-Si plug 34 constitutes the diffusion barrier layer of the lower electrode, and is formed with standard sputtering and etching techniques. The TiN layer has an aspect ratio defined by the height $d_1$ divided by the width $d_2$. This embodiment illustrates an aspect ration less than 1.

Figure 3:
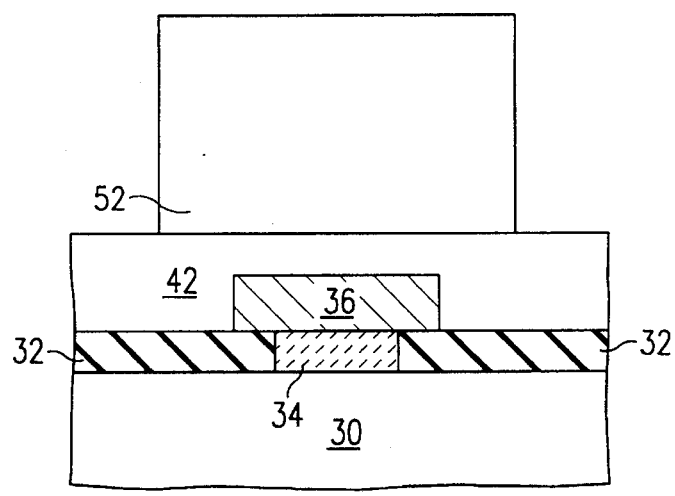

A 200 nm Pt layer 42, illustrated in FIG. 3, is then DC sputter deposited in a 5 mTorr Ar atmosphere using a Pt target with the substrate temperature held at 325° C. After application of the Pt layer 42, photoresist 52 is applied and etched to form a mask as show in FIG. 3. Pt layer 42 can also be deposited using e-beam evaporation, CVD, or metal organic CVD (MOCVD). The height of Pt layer 42 can vary depending on the desired capacitance density of the advanced dielectric material, the total desired capacitance, and the generation of the device. For example, future devices such as 1 Gbit DRAMs may generally require taller capacitors to provide more electrode surface area compared to 256M DRAM devices, since 1 Gbit DRAMs will generally need to meet the charge storage requirement of 25 fF/cell. The height of layer 36 can be increased within layer 42 to reduce the amount of platinum used in the structure. The reduction of platinum is desirable for at least two reasons. First, Pt has a radioactive isotope Pt-190 that makes up a small percentage of the total number of Pt atoms. Reduction of the Pt will reduce the number of alpha-particles emitted which could cause soft errors in the device. Second, Pt is very costly and a thinner layer will reduce the amount of material used.

Figure 4:
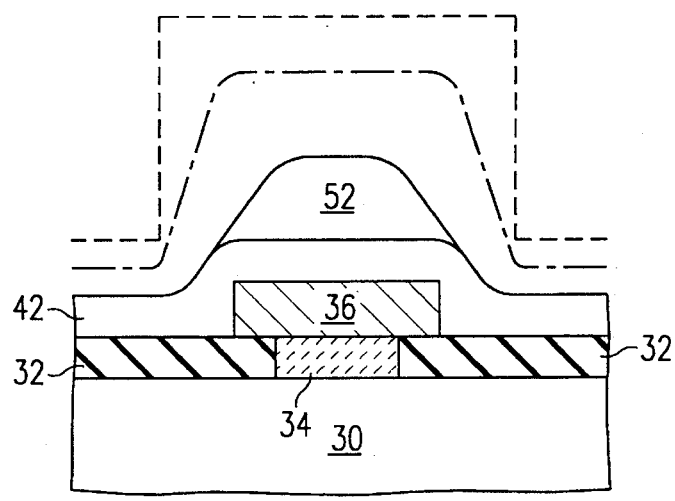

FIG. 4 shows what is believed to be the shape of Platinum layer 42 and the photoresist layer 52 as it changes during the etch process. This process includes using an Electron Cyclotron Resonance (ECR) plasma etching reactor with a $Cl_2$/Ar atmosphere (50%, 50%) at 0.0°. The temperature of substrate, $T_s$ is controlled with a He cooled chuck to below 50° C. The substrate is negatively biased to between 200 and 300 V from the potential of the system. The plasma density for this embodiment in the range of $10^{11}$ ions/cm$^3$ to $10^{12}$ ions/cm$^3$. The ECR reactor includes a lower multipolar magnetic confinement structure to confine the plasma. This confinement of the plasma in combination with the plasma energy and the selectivity of the photoresist results in more horizontal etch of the platinum and photoresist as shown in FIG. 4 to obtain the lower angle sidewall slopes.

Figure 5:
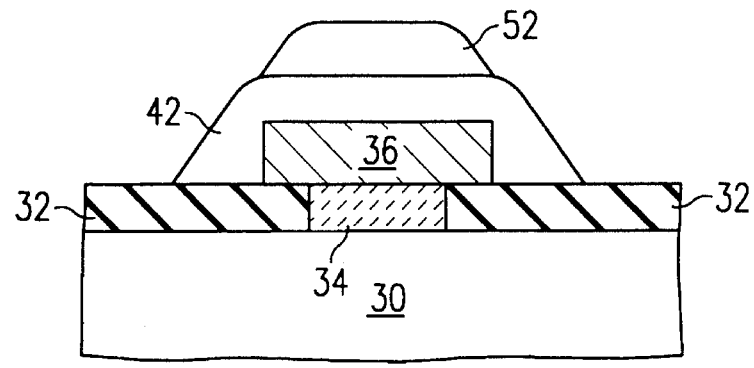
Figure 6:
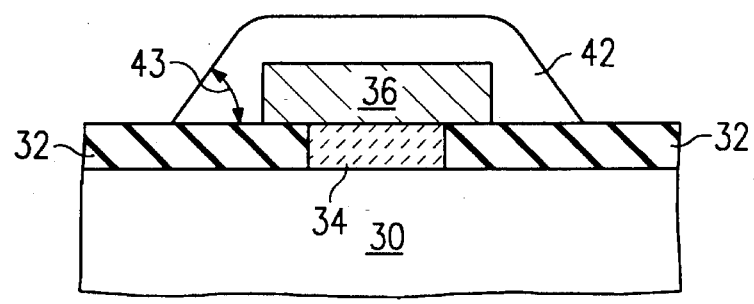

FIG. 5 shows the sloped sidewall of the Platinum layer produced by the present invention after the completion of the etch process and before removal of the photoresist. FIG. 6 shows the sloped sidewall of the Platinum layer produced by the present invention after removal of the photoresist. The present invention etch process can give sloped angles from about 85 to 30 degrees. The angle is the acute angle between the insulator surface 32 and a tangent of the Platinum layer at about the midpoint of the slope as shown in FIG. 6, to give the general angle of the sidewall but not including the roundness of the top portion of the sidewall.

Since the oxidation rate of the barrier layer 36 is generally much more rapid at the beginning of the advanced dielectric deposition process than later, it is generally beneficial to perform partial oxidation in order let the structure react to less strenuous oxidizing conditions before advanced dielectric deposition. For example, if the metal-organic chemical vapor deposition (MOCVD) of the advanced dielectric material occurs at 650° C. in 1 Torr $O_2$ for 3 minutes, then the structure could be annealed at 600° C. for 20 minutes in 1 Torr $O_2$ before advanced dielectric deposition. The lower temperature generally has some advantage in that it slows the oxidation rate down and allows Pt layer 42 more time to relax than if the oxidation is performed at full deposition temperature. Another benefit of this oxidation anneal process is that Pt layer 42 can rearrange to further round any corners after being etched.

Figure 7:
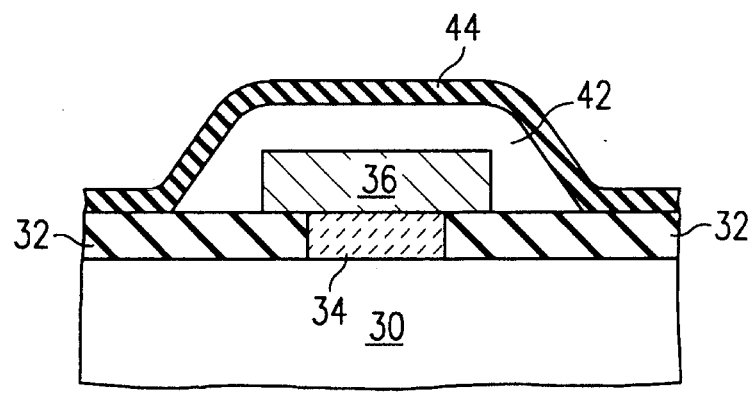
Figure 8:
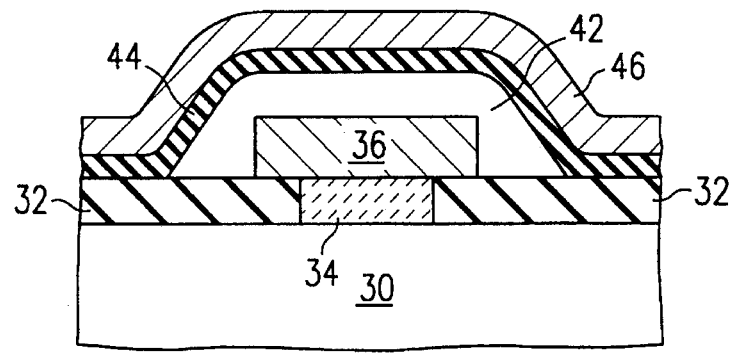

As described hereinabove, BST layer 44 may be deposited by MOCVD techniques to form the structure shown in FIG. 7. The deposition may use ionic, photonic, electronic or plasma enhancement. It may also be formed by CVD, sputter or spin coat methods. With the structure of FIG. 7, the sloped sidewalls of the Pt layer 42 form an electrode with rounded corners while retaining full electrical contact over the surface area between Pt layer 42 and BST layer 44. Electrical contact from Pt layer 42 to substrate 30 is made through the TiN layer 36. The upper electrode 46 shown in FIG. 8 is applied using standard processes such as CVD or sputtering.

Figure 9:
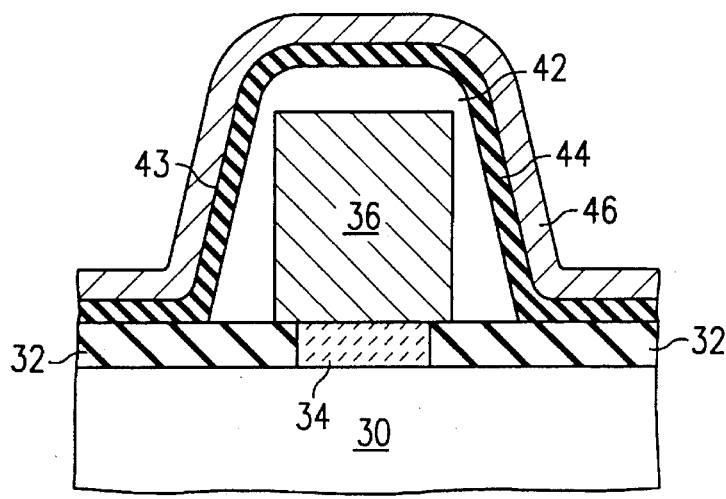
FIG. 9 is an alternative embodiment of the method illustrating a higher aspect ratio.

In an alternate embodiment, FIG. 9 illustrates a capacitor with a high aspect ratio, and with a Pt upper electrode layer 46 added. TiN layer 36 has been made higher relative to its width to give an aspect ratio greater than 1. This embodiment illustrates the advantage of keeping the sidewalls of the lower electrode that are in contact with BST layer 44 conductive because it allows higher capacitance in a given substrate surface area due to the increased electrode surface area in addition to the increased capacitance due to the advanced dielectric.

Figure 10:
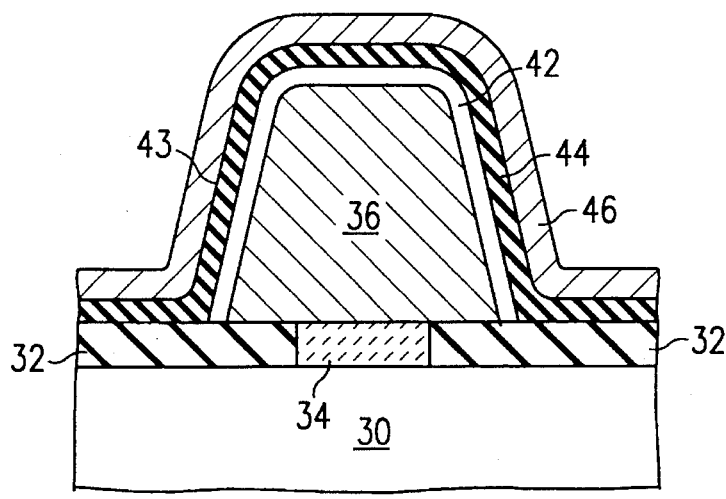
FIG. 10 is an alternative embodiment of the method illustrating a sloped barrier layer.

FIG. 10 illustrates an alternate embodiment wherein the method of the present invention was used to etch the barrier layer 36 rather than the unreactive layer 42. The unreactive layer may then be applied by CVD or sputtering processes. An additional alternative could use the structure of FIG. 10 but use an insulative material for layer 36 (in place of the barrier layer materials) and a buried contact or connection to the plug below.

The sole Table, below, provides an overview of some embodiments and the drawings.

TABLE

| Drawing Element | Preferred or Specific Examples | Generic Term | Other Alternate Examples |
|---|---|---|---|
| 30 | Silicon | Substrate | Other single component semiconductors (e.g. germanium, diamond) Compound semiconductors (e.g. GaAs, InP, Si/Ge, SiC) Ceramic substrates |
| 32 | Silicon dioxide | First level insulator | Other insulators, doped or undoped (e.g. silicon nitride, BSG, PSG, BPSG) Multiple layers of combinations of the above materials (e.g. Si$_3$N$_4$ barrier over SiO$_2$) May or may not be used (i.e. first level insulator, substrate, another insulating layer of a combination thereof may be the supporting layer for the lower electrode) |
| 34 | Poly-Silicon | Conductive Plug | TiN/TiS$_2$/Poly-Si, TiN/Poly-Si, TiN, WN, WN/WSi/Poly-Si, reactive metal compounds, reactive metals, conductive carbides and borides, compound semiconductors (e.g. GaAs, InP, Si/Ge, SiC) |
| 36 | TiN | Barrier layer | Other conductive metal compounds, ternary (or greater) amorphous nitrides (e.g. Ta—Si—N, Ti—Si—N, Ta—B—N, Ti—B—N, HfN, ZrN, TiWN, WN, TiAlN), exotic conductive nitrides or their alloys, noble metal insulator alloys Other silicides may be used in a composite structure (Ni silicide, Co silicide, tungsten silicide) May be a layer having relatively better barrier properties over a layer having relatively better adhesive properties (e.g. Ru/TiN) Multiple layers or Combinations of the above materials |
| 42 | Platinum | Unreactive layer | Other noble or platinum group metals (e.g. palladium, iridium, rhenium, rhodium, gold, silver) Conductive metal compounds (e.g. oxides: ruthenium oxide, tin oxide, titanium monoxide, indium oxide, rhenium oxide, osmium oxide, rhodium oxide, iridium oxide; doped oxides: doped tin, indium or zinc oxide; nitrides: ruthenium nitride, tin nitride, titanium nitride, zirconium nitride) |

TABLE-continued

| Drawing Element | Preferred or Specific Examples | Generic Term | Other Alternate Examples |
|---|---|---|---|
| | | | Layers of combinations of the above materials |
| 43 | Sidewall Angle | Sloped Sidewall | |
| 44 | Barium strontium titanate | High-dielectric-constant material layer | Other perovskite, pyroelectric, ferroelectric, or high-dielectric-constant oxides (e.g. (Ba,Sr,Ca,Pb)(Ti,Zr)O$_3$, (Pb,La)(Zr,Ti)O$_3$, bismuth titanate, potassium tantalate, lead scandium tantalate, lead niobate, potassium niobate, lead zinc niobate, lead magnesium niobate, tantalum pentoxide, yttrium oxide) Donor, acceptor, or donor and acceptor doped oxides listed above Multiple layers or combinations of the above materials |
| 52 | Photoresist | Etch resist | Any compound suitable for semiconductor processing techniques which has the selectivity required for the process of this invention |
| 46 | Platinum | Upper electrode | Conductive metal compounds, other noble or platinum group metals, reactive metals (e.g. tungsten, tantalum, titanium, molybdenum), other common semiconductor electrodes (e.g. aluminum, doped Si or Ge). Multiple layers or combinations of the above materials |

A few preferred embodiments have been described in detail hereinabove. It is to be understood that the scope of the invention also comprehends embodiments different from those described, yet within the scope of the claims. Implementation is contemplated in discrete components or fully integrated circuits in silicon, germanium, gallium arsenide, or other electronic materials families.

The etch profile illustrated in FIG. 4 results from the etch process of the present invention. An important parameter for controlling the slope is the horizontal component of the etch. The horizontal component can be varied from a near anisotropic etch to a near isotropic etch, using the selectivity and ECR reactor parameters such as ion density, and ion energy. Increasing the horizontal component of the etch process should yield a lower sidewall slope.

Another significant parameter of the etch process of this invention is the thickness of the photoresist, used in combination with the selectivity of the etch, and process parameters which affect selectivity between the photoresist and the platinum. Normally the photoresist is made sufficiently thick to prevent total erosion before the etch of the unprotected areas is completed, and the resist is chosen with a selectivity such that the etch rate of the material to be etched is higher than that of the resist. However, if thickness and selectivity are chosen to result in the photoresist being etched away, the bottom electrode is exposed to vertical as well as horizontal etch prior to the termination of the etch process resulting in a lower sidewall angle.

SiO$_2$ layer 32 may or may not be capped with an adhesion layer such as TiO$_2$, Ti, Zr, TiN, or ZrO$_2$ to provide better adhesion for the platinum and a lateral oxygen diffusion barrier. Also, a layer of $TiSi_2$ could be formed in the interfacial region between the TiN 36 and the poly-Si plug 34 and extra N introduced into the TiN by using a rapid thermal nitridation process, resulting in better oxidation resistance for the TiN and better conduction to the poly-Si from the $TiSi_2$.

In each of the embodiments discussed, barrier layer 36 may extend below the surface of the insulator layer 32 into the channel area occupied by the poly-Si plug 34. An additional variation anticipated by the present invention includes forming the entire barrier layer 34 in the channel area occupied by the poly-Si plug 32. The plug, either recessed or planer, can be accomplished by either etch-back or chemical mechanical polishing (CMP) processes.

As per the discussion above, a higher aspect ratio allows a larger surface area in contact with the advanced dielectric material, to maximize capacitance for a given amount of semiconductor real estate. On the other hand, a sloped sidewall allows the corner of the electrode to be rounded to prevent cracking of the advanced dielectric. There is obviously a trade off between a higher aspect ratio and slope. As slope is decreased to a smaller angle, the aspect ratio experiences a corresponding reduction for a fixed substrate area. The preferred angle for embodiments of the present invention is less than 80 degrees and greater than 30 and more preferable less than or equal to 75 and greater than 50, and most preferably between 75 and 60 degrees.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic structure, said method comprising steps:
   (a) forming a conductive barrier layer on a principal surface of a microelectronic substrate where said conductive barrier layer comprises a lateral surface and an upper surface forming a corner edge;
   (b) forming an unreactive layer on said barrier layer,
   (c) patterning photoresist on said unreactive layer,
   (d) etching said unreactive layer by dry plasma etch with at least partial horizontal etching to form sloped lateral sides on said unreactive layer, overlying said corner edge on said barrier layer wherein said sloped lateral sides are at an angle of less than 80 degrees from the substrate surface; and
   (e) depositing a high-dielectric-constant material layer on said unreactive layer.

2. The method according to claim 1, wherein said sloped lateral sides are at an angle of less than 75 degrees and greater than 40 degrees from the substrate surface.

3. The method according to claim 1, wherein said dry plasma process is an Electron Cyclotron Resonance plasma etch process.

4. The method according to claim 1, wherein said barrier layer is of a material selected from the group consisting of: conductive metals, conductive metal nitrides, conductive metal oxides, conductive metal silicides, conductive metal carbides, conductive metal borides, ternary amorphous nitrides, and combinations thereof, or chosen from the group consisting of titanium aluminum nitride, Zr nitride, Hf nitride, Y nitride, Sc nitride, La nitride, N deficient Al nitride, doped Al nitride, Mg nitride, Ca nitride, Sr nitride, Ba nitride, TaSi nitride, TiSi nitride, and combinations thereof.

5. The method according to claim 1, wherein said unreactive layer is selected from the group consisting of: platinum, palladium, iridium, rhenium, rhodium, gold, silver, ruthenium oxide, tin oxide, titanium monoxide, indium oxide, rhenium oxide, osmium oxide, rhodium oxide, iridium oxide, doped tin oxide, doped indium oxide, doped zinc oxide, ruthenium nitride, tin nitride, titanium nitride, zirconium nitride, $(La,Sr)CoO_3$, $SrRuO_3$, and combinations thereof.

6. The method according to claim 1, wherein said high-dielectric-constant material layer is selected from the group consisting of: barium strontium titanate, lead zirconate titanate, lead lanthanum titanate, lead lanthanum zirconate titanate, bismuth titanate, potassium tantalate, lead scandium tantalate, lead niobate, lead zinc niobate, potassium niobate, lead magnesium niobate, and combinations thereof.

7. The method according to claim 1, said method further comprising forming an upper electrode on said high-dielectric-constant material layer.

8. The method according to claim 7, wherein said upper electrode comprises platinum.

9. A method of forming a microelectronic structure, said method comprising steps:
   (a) forming a conductive barrier layer on a principal microelectronic substrate surface, said barrier layer comprising a lateral surface and an upper surface forming a corner edge;
   (b) forming an unreactive layer, consisting of Platinum, on said barrier layer,
   (c) patterning photoresist on said unreactive layer,
   (d) etching said unreactive layer by dry plasma etch with at least partial horizontal etching to form sloped lateral sides on said unreactive layer, overlying said corner edge on said barrier layer, with said slope at an angle less than 75 degrees; and
   (e) depositing a high-dielectric-constant material layer on said unreactive layer.

10. The method according to claim 9, wherein said barrier layer is of a material selected from the group consisting of: titanium aluminum nitride, Zr nitride, Hf nitride, Y nitride, Sc nitride, La nitride, N deficient Al nitride, doped Al nitride, Mg nitride, Ca nitride, Sr nitride, Ba nitride, TaSi nitride, TiSi nitride, and combinations thereof.

11. The method according to claim 9, wherein said unreactive layer is of a material selected from the group consisting of: platinum, palladium, iridium, rhenium, rhodium, gold, silver, ruthenium oxide, tin oxide, titanium monoxide, indium oxide, rhenium oxide, osmium oxide, rhodium oxide, iridium oxide, doped tin oxide, doped indium oxide, doped zinc oxide, ruthenium nitride, tin nitride, titanium nitride, zirconium nitride, $(La,Sr)CoO_3$, $SrRuO_3$, and combinations thereof.

12. The method according to claim 9, wherein said high-dielectric-constant material layer is selected from the group consisting of: barium strontium titanate, lead zirconate titanate, lead lanthanum titanate, lead lanthanum zirconate titanate, bismuth titanate, potassium tantalate, lead scandium tantalate, lead niobate, lead zinc niobate, potassium niobate, lead magnesium niobate, and combinations thereof.

13. The method according to claim 9, said method further comprising forming an upper electrode on said high-dielectric-constant material layer.

14. The method according to claim 9, said method further comprising forming an unreactive layer with an aspect ratio greater than 1.

15. A method of forming a microelectronic structure, said method comprising steps:
  (a) forming a conductive barrier layer on a principal microelectronic substrate surface, said barrier layer comprising a lateral surface and an upper surface forming a corner edge;
  (c) patterning photoresist on said barrier layer,
  (d) etching said barrier layer by ECR plasma etch with at least partial horizontal etching to form sloped lateral sides on said unreactive layer, overlying said corner edge on said barrier layer, with said slope at an angle less than 75 degrees; and
  (e) forming an unreactive layer on said barrier layer; and
  (f) depositing a high-dielectric-constant material layer on said unreactive layer.

16. The method according to claim 15, wherein said barrier layer is of a material selected from the group consisting of: titanium aluminum nitride, Zr nitride, Hf nitride, Y nitride, Sc nitride, La nitride, N deficient Al nitride, doped Al nitride, Mg nitride, Ca nitride, Sr nitride, Ba nitride, TaSi nitride, TiSi nitride, and combinations thereof.

17. The method according to claim 15, wherein said unreactive layer is selected from the group consisting of: platinum, palladium, iridium, rhenium, rhodium, gold, silver, ruthenium oxide, tin oxide, titanium monoxide, indium oxide, rhenium oxide, osmium oxide, rhodium oxide, iridium oxide, doped tin oxide, doped indium oxide, doped zinc oxide, ruthenium nitride, tin nitride, titanium nitride, zirconium nitride, $YBa_2Cu_3O_{7-x}$, $(La,Sr)CoO_3$, $SrRuO_3$, and combinations thereof.

18. The method according to claim 15, wherein said high-dielectric-constant material layer is selected from the group consisting of: barium strontium titanate, lead zirconate titanate, lead lanthanum titanate, lead lanthanum zirconate titanate, bismuth titanate, potassium tantalate, lead scandium tantalate, lead niobate, lead zinc niobate, potassium niobate, lead magnesium niobate, and combinations thereof.

19. The method according to claim 16, said method further comprises forming a platinum upper electrode on said high-dielectric-constant material layer.

* * * * *